United States Patent
Porod et al.

(10) Patent No.: US 9,577,173 B2
(45) Date of Patent: Feb. 21, 2017

(54) MONO-METALLIC THERMOCOUPLES

(71) Applicant: University of Notre Dame du Lac, Notre Dame, IN (US)

(72) Inventors: Wolfgang Porod, Granger, IN (US); Gary H. Bernstein, Granger, IN (US); Alexei Orlov, South Bend, IN (US); Gergo P. Szakmany, Notre Dame, IN (US)

(73) Assignee: University of Notre Dame du Lac, Notre Dame, IN (US)

( * ) Notice: Subject to any disclaimer, the term of this patent is extended or adjusted under 35 U.S.C. 154(b) by 0 days.

(21) Appl. No.: 14/280,242

(22) Filed: May 16, 2014

(65) Prior Publication Data

US 2014/0338712 A1 Nov. 20, 2014

Related U.S. Application Data

(60) Provisional application No. 61/824,042, filed on May 16, 2013.

(51) Int. Cl.
    *H01L 35/32* (2006.01)
    *G01J 5/12* (2006.01)
    *B82Y 30/00* (2011.01)

(52) U.S. Cl.
    CPC .................. *H01L 35/32* (2013.01); *G01J 5/12* (2013.01); *B82Y 30/00* (2013.01); *G01J 2005/123* (2013.01)

(58) Field of Classification Search
    CPC ........ G01J 5/12; G01J 5/022; G01J 2005/123; H01L 35/04; H01L 35/10; H01L 35/32; H01L 35/34; H01L 37/02; H01L 37/025; H01L 37/04; B82Y 30/00; B82Y 40/00; B82Y 99/00; H01J 2005/126
    See application file for complete search history.

(56) References Cited

PUBLICATIONS

Liu et al., "An Extremely Simple Thermocouple Made of a Single Layer of Metal", 2012, Advanced Materials, 24, pp. 3275-3279.*
Chong et al., "Antenna-coupled polycrystalline silicon air-bridge thermal detector for mid-infrared radiation", 1997, Applied Physics, Letter 71, pp. 1607-1609.*
Krenz et al., "Response Increase of IR Antenna-Coupled Thermocouple Using Impedance Matching", Mar. 12, 2012, IEEE Journal of Quantum Electronics, Volumne 48 No. 5, pp. 659-664.*
This Old House, "Iron and Steel a trip inside a steel mill", 2015.*
Szakmany, Gergo P., et al., AIP Publishing, Journal of Applied Physics, Comment on "Unexpected size effect in the thermopower of thin-film stripes" [J. Appl. Phys. 110, 083709 (2011)], 5 pgs.
Huo, Xiaoye et al., AIP Publishing, Journal of Applied Physics, Response to "Comment on 'Unexpected size effect in the thermopower of thin-film stripes'" [J. Appl. Phys. 115, 236101 (2014)], 3 pgs.

* cited by examiner

*Primary Examiner* — Devina Pillay
*Assistant Examiner* — Daniel Malley, Jr.
(74) *Attorney, Agent, or Firm* — Greenberg Traurig, LLP

(57) ABSTRACT

Nanoscale thermocouples are made of a single material and are shape-engineered to contain one or more variations in their width along their length. The mono-metallic nanowire junctions resulting from the width variation(s) exploit a difference in the Seebeck coefficient that is present at these size scales. Such devices have a wide variety of uses and can be coupled with an antenna in order to serve as an infrared detector.

23 Claims, 10 Drawing Sheets

MONO-METALLIC THERMOCOUPLES

CROSS REFERENCE TO RELATED APPLICATIONS

This application claims priority under 35 U.S.C 119(e) to U.S. Provisional Patent Application No. 61/824,042 filed on May 16, 2013, the content of which is incorporated herein in its entirety.

FIELD OF THE DISCLOSURE

The disclosed technology generally relates to thermocouples constructed of a single material and, more particularly, relates to the operation of a thermocouple having a junction whereat there are at least two different cross-sectional areas.

BACKGROUND OF THE DISCLOSURE

Thermocouples (TCs) have proven invaluable in thermoelectric energy conversion. Their ability to generate electrical power, low cost, and high sensitivity make them ubiquitous in applications ranging from industrial control to home thermostats, including on-chip differential thermometry, energy harvesting, and detection of millimeter waves and infrared radiation. The operating principle of TCs is based on the Seebeck effect, which is the property of an electrical conductor to develop an electric field in response to a temperature difference across it. Different materials will exhibit this property to varying degrees, meaning for a given temperature gradient across two different materials a different voltage potential may be generated.

Thermocouples have been constructed from two dissimilar conductors (A and B) having different absolute Seebeck coefficients ($S_A$ and $S_B$). An open-circuit voltage, $V_{OC}$, develops across the hot and the cold junctions in response to a temperature difference, $\Delta T$. The open-circuit voltage is proportional to both this temperature difference and the difference in absolute Seebeck coefficients according to equation (1).

$$V_{OC} = (S_A - S_B)\Delta T \qquad \text{Eqn (1)}$$

Fabrication of bi-metallic thermocouples is necessarily complicated by the fact that two different metals must be fabricated to form a physical junction there between. This fabrication process is made even more difficult at submicron scale which requires finer control due to the smaller dimensions. Current fabrication methods for bimetallic junctions include lithographic and growth methods. The requisite control methods and fabrication method for bi-metallic thermocouple fabrication can be expensive and cumbersome. Therefore, there exists a need for a thermocouple design which would eliminate these difficulties.

BRIEF SUMMARY OF THE DISCLOSURE

Described herein are "shape-engineered" thermocouples that are formed from a single layer of metal with cross-sectional discontinuity. Specific examples of such shape-engineered thermocouples are mono-metallic thermocouples (TC) constructed from a lithographically defined nanowire so as to have an abrupt variation or a smooth variation in width along its length. Because the fabrication complexity of such shape-engineered, mono-metallic nanowire TCs is greatly reduced compared to that of conventional bi-metallic TCs, the described TCs can be mass-produced using simpler manufacturing techniques. Additionally, their small thermal volume and size allows sub-microsecond response times with high spatial resolution which could be useful in such applications as real-time on chip temperature sensors as well as high-speed infrared imagers.

The thermocouples described herein may also be combined with an antenna such that the radio-frequency induced antenna currents heat the thermocouple junction. The antennas in such a system can be made to be frequency selective, thereby generating an open-circuit voltage from the thermocouple upon illumination at specific frequencies. Because of the inherent relationship between signal wavelength and the physical size of the antenna, nanoscale antenna structures are capable of detecting signals in the long-wave infrared (LWIR) spectrum.

DETAILED DESCRIPTION

Thermocouples, which traditionally consist of two wires made of dissimilar conductors with different absolute Seebeck coefficients (S), produce an open-circuit voltage according to equation (1) above when a temperature difference is generated across its hot and cold junction. However, it has also been found that in a single material, the Seebeck coefficient decreases as the wire dimensions shrink from the bulk to the nanoscale range. As can be seen from both FIG. 2 and FIG. 10, above 1 μm, the relative Seebeck coefficient is virtually size-invariant. Below this scale, the Seebeck coefficient begins to decrease.

The mono-metallic thermocouples described herein take advantage of this change in the Seebeck coefficient in nanoscale wires. Unlike traditional bimetallic thermocouples, the two conductors are fabricated from the same material, and the Seebeck coefficient difference between the hot and cold junctions is due to size difference found at the junction of the conductors. As used herein such thermocouples are referred to as "shape-engineered thermocouples" or "shape-engineered TCs."

Figure 1:
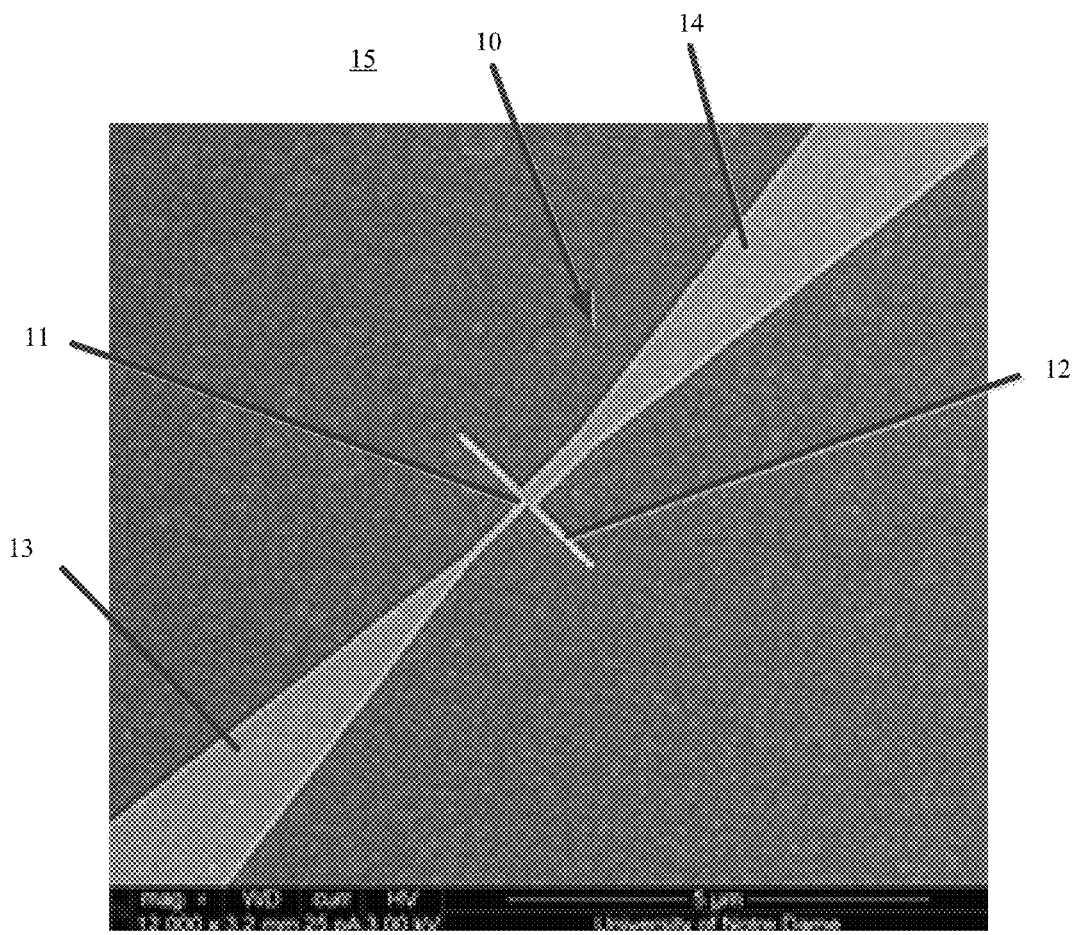
FIG. 1 is a scanning electron micrograph of a shape-engineered thermocouple with a dipole antenna co-located with the junction of the discontinuous cross-sectional area.

Shape-engineered thermocouples can be formed by constructing a single contiguous nanowire made out a single material with a change in its cross-sectional area. The difference in the cross-sectional dimension of the nanowires forming a thermocouple can be achieved through width-variation, since the width can be accurately controlled by electron-beam lithography, while the thickness of the metal layer is defined by a single metal deposition. As shown in FIG. 1, the shape-engineered thermocouple 10 is constructed out of a single material which has one lead of a narrower width 13 and another lead of a wider width 14 which produce a discontinuity in the cross-sectional area 11.

When the physical dimensions of a conductor (film thickness or wire width) are reduced to the mean free path of electrons in the bulk, electron scattering is increased due to surface and interface scattering, and may have a significant effect on both the electronic and thermal transport properties. Consequently, absolute Seebeck coefficients in thin films and nanowires are reduced compared with their bulk values, as described by the Fuchs-Sondheimer conduction model (as described in "Theoretical description of grain-boundary electron-scattering by an effective mean path", Thin Solid Films, vol. 51, no. 3, June 1978 and "Thermoelectric power of thin polycrystalline metal films in an effective mean free path model. J. of Phys. F: Metal Physics, vol. 10, no. 9 September 1980 both of which are herein incorporated by reference in their entirety). These size-dependent phenomena are entirely classical, and not due to quantum-mechanical size quantization.

As thermocouple dimensions are reduced to the nanoscale, they become comparable to an electron's thermal scattering length. The reduction in the absolute Seebeck coefficient is more pronounced in the narrower nanowires which gives rise to a non-zero relative Seebeck coefficient. In traditional bi-metallic thermocouples, a relative Seebeck coefficient is achieved due to the difference in the chemical properties of the materials. An open-circuit voltage is achieved because, at the same temperature gradient, the bulk transport of electrons in two dissimilar metals will depend on their material properties. However, in the shape-engineered thermocouples disclosed herein the dimensions are made sufficiently small such that the electron scattering differences in the nanowires of different cross-sectional areas affects overall electron transport.

In some embodiments, the nanowires have a cross-section area where all dimensions are equal to or less than 1 µm, equal to or less than 750 nm, equal to or less than 500 nm, or equal to or less than 350 nm. In some embodiments the width of the narrower nanowire is equal to or less than 150 nm, equal to or less than 100 nm, equal to or less than 70 nm, or equal to or less than 50 nm. In some embodiments the width of at least one nanowire is varied along its length. In some embodiments the width ratio of the two nanowires is between 6.0 and 1.0. In some embodiments the difference between the two nanowires is less than 1 µm, less than 750 nm, less than 500 nm, less than 350 nm, less than 300 nm, less than 250 nm, less than 150 nm, less than 100 nm, or less than 50 nm.

In another embodiment, the junction of the two nanowire widths is graded rather than an abrupt change in width or cross-sectional area. The difference in the geometric dimensions between the two thermocouple leads may include any combination of widths along the length of the thermocouple leads. The difference in cross-sectional area between two thermocouple leads or along the length of one lead may or may not be discontinuous. Variations in cross-sectional areas may vary in a continuous or a smooth fashion.

The merits of the method for making and using the shape-engineered thermocouple of this disclosure will become apparent with reference to the following description and examples which are disclosed here as an aide in its understanding and should not be viewed as limiting the invention as recited in the claims that are set forth below.

Fabrication of Thermocouples

Figure 6:
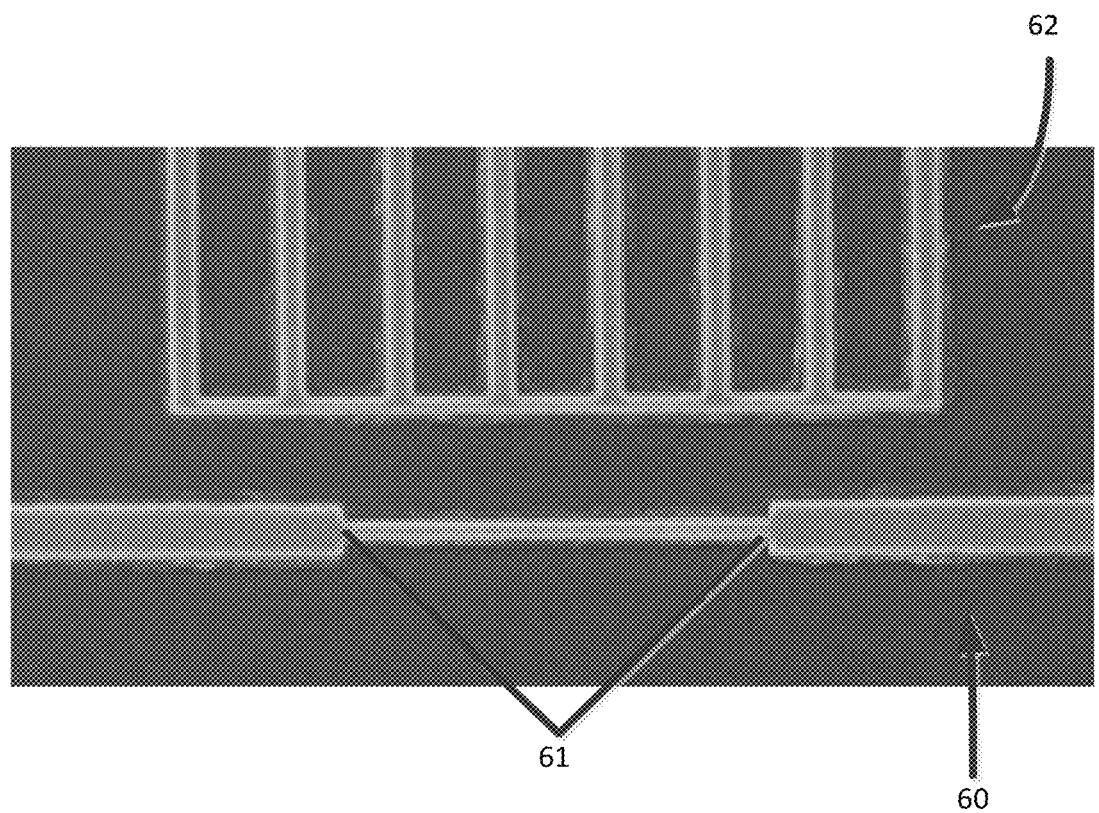
FIG. 6 is a scanning electron micrograph of a thermocouple arrangement with two geometric discontinuities and a heater bank for testing.
Figure 8:
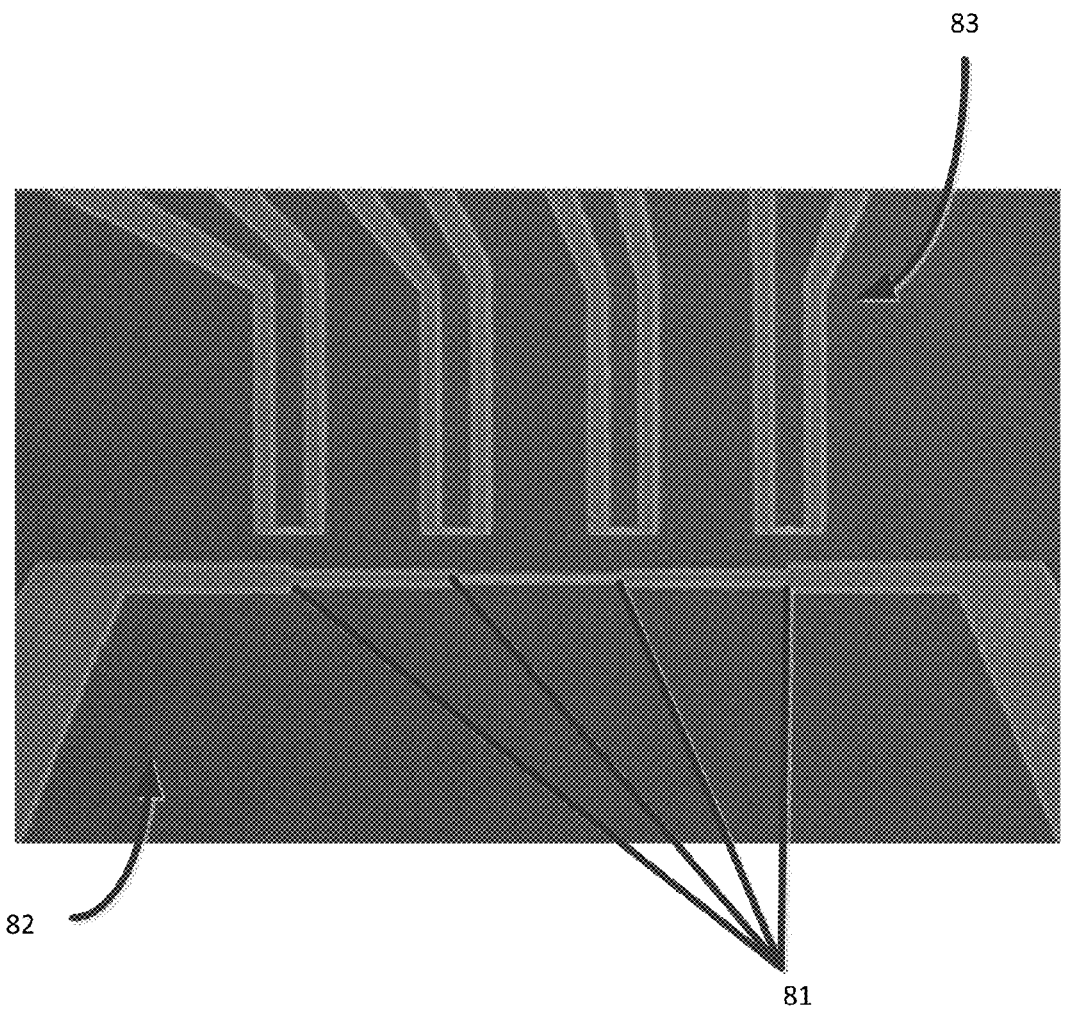
FIG. 8 is a scanning electron micrograph of a thermocouple with three different cross-sectional areas.

The nanoscale structures were patterned with electron beam lithography using a conventional methyl-methacrylate (MMA) and polymethyl-methacrylate (PMMA) double-layer resist structure. The patterns were developed for 40 seconds in a mixture of methyl-isobutyl-ketone (MIBK) and isopropyl alcohol (IPA) having a ratio of 1:3 with 1.5% methyl-ethyl-ketone (MEK). The shape-engineered TCs were formed from 45 nm thick Ni deposited in an electron beam evaporator. Lift-off was performed in 1-methyl-2-pyrrolidinone (NMP). Scanning electron micrographs of completed devices are shown in FIG. 6 and FIG. 8. Monometallic, shape-engineered thermocouples were fabricated using a range of materials including Ni, Pd, and Cr by means of electron beam lithography and lift-off. The same type of thermoelectric behavior was exhibited for each mono-metallic thermocouple despite the specific material used further indicating the effect is attributable to the shape engineering.

Imprint lithography may also be used to stamp the single-metal structures on the surface of a substrate. This process could support large scale manufacturing such as a roll-to-roll printing process which would lower the unit cost of a device. Fabrication of these structures is greatly simplified because they are made of a single material so no alignment is required unlike traditional bi-metallic thermocouple.

Returning to FIG. 6, the shape-engineered thermocouple 60 has one segment of a narrow width between two segments of wider width forming two junction points 61. The width of the narrow segment is 50 nm while the width of the wider segments is 150 nm. In this embodiment two discontinuous cross-sectional junctures 61 are formed. As can be seen in the embodiment depicted in FIG. 8, width changes were used to create four discontinuous cross-sectional junctures 81. Specifically, the shape-engineered thermocouple 82 comprises segments of varying width in which the middle section is 50 nm followed by segments of 150 nm and finally segments of 300 nm on the outside. The shape-engineered thermocouple 82 and the results show in FIG. 9 and discussed in Example 1 further demonstrates the dependence of $V_{OC}$ on the parameters of cross-sectional discontinuity. In the thermocouple arrangement shown on FIG. 8, multiple thermocouples are formed from the contiguous nanowire wire (e.g., a first thermocouple characterized by the width variation between 150/50 nm, a second thermocouple characterized by the width variations between 300/150 nm, and a third thermocouple, characterized by the width variations between 300/50 nm) by considering the law of intermediate material which states that a third material can be inserted into the hot or cold junction of a TC so long as the two new junctions formed by the third material are at the same temperature. A shape-engineered thermocouple of this invention may comprise more than two diameters and may vary in their diameter along their length between the hot and cold junction.

EXAMPLE 1

Thermocouple Design and Functionality

This example demonstrates the existence of a thermoelectric effect based on a cross-sectional discontinuity in single-metal wires.

Referring to FIG. 6, fabricated shape-engineered thermocouples 60 were connected to bonding pads and located about 25 μm away from a bank of resistance heaters 62. Simulations and temperature measurements using resistance temperature detectors (RTDs) located in close proximity to these junctions confirmed that the temperature remained unchanged for any combination of heater currents used in the experiments within 10 mK accuracy.

Measurements of the shape-engineered TC 61 used the 2ω method which is herein described. For an AC heater current $I(\omega) = I_0 \cos(\omega t)$ with an angular frequency (ω) and amplitude ($I_0$), the power dissipated due to Joule heating is proportional to the square of the current:

$$P = I_0^2 R/2 * (1 + \cos(2\omega t)) \quad \text{Eqn (2)}$$

where R is heater resistance. Because R is a weak function of I, varying by less than one percent for the small currents used, it was treated as a constant. The temperature was varied at twice the frequency of the current. Therefore, the open-circuit voltage of the TCs varied as 2ω. The frequency dependence of the 2ω signal was measured and it remained flat up to about 2π*500 kHz.

The data reported herein were acquired at 2ω=167 Hz*4π.

Open-circuit voltage measurements were performed using a low-noise differential-voltage amplifier with a gain of 100, and a lock-in amplifier tuned to the second harmonic at a phase angle of −90 degrees to account for phase shift between the reference sine wave and the 2ω thermoelectric conversion product. The lock-in amplifier was designed to measure the RMS values of sinusoidal signals, so the measured signal was multiplied by a factor of $2^{1/2}$.

In FIG. 6, the heaters 62 comprised the horizontal elements while the vertical elements comprised the heater leads. Heat was applied locally by passing current through the appropriate vertical leads so that one or more horizontal heater segments were selectively activated. The horizontal elements of the heater 62 are hereinafter labeled as they appear from left to right as L3, L2, L1, C, R1, R2, and R3.

When current flowed through heaters L3, L2, or L1 of heater 62, the leftmost junction discontinuity 61 acted as the hot junction of the TC. Due to effective heat removal by the substrate, negligible heat flowed to the rightmost junction discontinuity 61 either through the wire or the substrate, which therefore remained at ambient temperature and acted as the cold junction.

Figure 7:
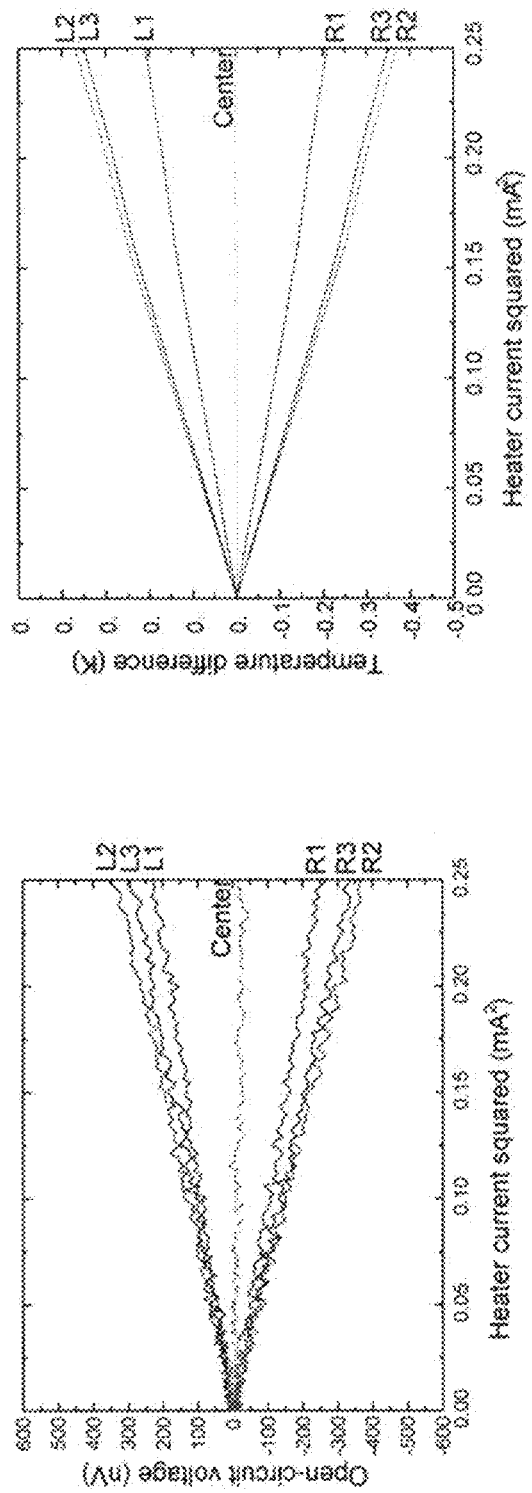
FIG. 7 is a graph of open circuit voltage and temperature difference as a function of heater currents for the various heaters as shown in FIG. 6.

FIG. 7 shows the experimentally measured open-circuit voltage as a function of the square of the heater current for various heaters activated. Heater L2 caused the largest open-circuit voltage, because it was located closest to the junction resulting in the most effective heating of the hot junction. For either heater L1 or L3, the measured open-circuit voltage was less than that due to L2 for the same current, since the temperature difference between the two junctions was less.

When current flowed through the right heaters R1, R2, or R3 of heater 62, the roles of the two junctions 61 were reversed. The magnitude of the measured open-circuit voltage was the same, but with the polarity reversed, as shown in FIG. 7. When the center heater, C, located equidistant from both junctions 61, was activated, the junctions are heated equally (ΔT=0), and it was seen that the measured $V_{OC}=0$. Similarly, when the same current flows simultaneously in symmetric pairs of heaters (e.g. L1 and R1, or L2 and R2, or L3 and R3), no temperature difference is sensed by the TC 61 (ΔT=0) resulting in $V_{OC}=0$.

In order to extract the relative Seebeck coefficient from the measured open-circuit voltages corresponding to such geometrical junctions, the temperature difference needed to be known. It was not possible to experimentally measure the temperature differences between the two junctions, so simulations using COMSOL Multiphysics® were employed.

As can be seen in FIG. 7, $V_{OC}$ is proportional to ΔT at the heater current values recorded. As heater current is increased both $V_{OC}$ and ΔT increase linearly with the square of the heater current value, demonstrating that the cross-sectional discontinuity 61 forms a functioning shape-engineered thermocouple 60 according to eqn 1 above.

In FIG. 8, the heaters 83 are the horizontal elements parallel to the axis of thermocouple and separated by the vertical lead control lines. Hereinafter, these elements are referenced from left to right as L22, L111, R11, and R22. Heater L33 is the operation of L11 and L22 together and heater R33 is the operation of R11 and R22 together. The heaters 83 are placed about 450 nm away from their respective junctions 81 (here, the heater leads are 200 nm wide). To drive the third TC (i.e. 300/50 nm junction), the two heaters (L11 and L22, or R11 and R22) are connected in series so that the same current passes through each of them, ensuring equal heating of the 300/150 and 150/50 junctions.

Figure 9:
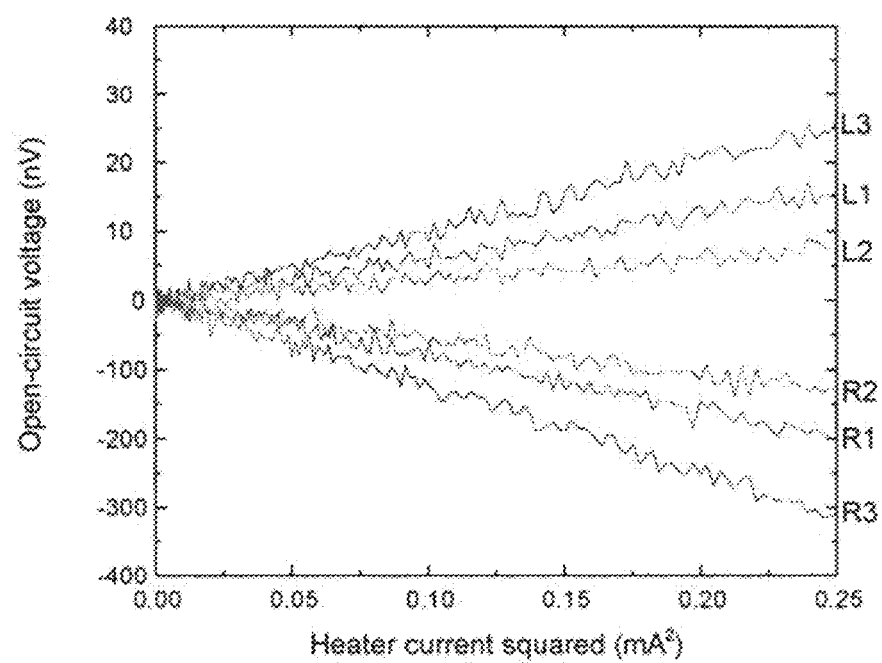
FIG. 9 is a graph of open-circuit voltage as a function of heater current for the various heater elements as shown in FIG. 8.

The open-circuit voltage as a function of the square of the heater current of the three TCs is presented in FIG. 9. It is noted that, to good approximation, $V_{OC}$ due to L33 ($V_{OC-L33}$), is the sum of $V_{OC-L22}$ and $V_{OC-L11}$. This is expected since the open-circuit voltage due to the series combination of two TCs must be equal to the sum of those of the individual TCs. Additionally, the measured open-circuit voltage is zero for L22 and R11 or, L22 and R22 heaters operating simultaneously due to the effectively zero temperature difference between the junctions. This experiment confirms that, at these size scales, the absolute Seebeck coefficient increases with segment width.

EXAMPLE 2

Relative Seebeck Coefficient Calculation

Direct determination of the relative Seebeck coefficient of the shape-engineered TCs requires measurement of the temperature difference simultaneously with that of the open-circuit voltage. Temperature measurement was accomplished by Kelvin sensing using a four-probe resistance calibrated temperature detector (RTD) placed in proximity to the hot junction of shape-engineered TCs with various different cross sectional widths. In particular the shape-engineered thermocouples that were studied all had one segment that was 50 nm wide while the wider segment width varied from 100 to 350 nm. Relative Seebeck coefficients of these shape-engineered TCs were directly obtained using simultaneous measurements of the open-circuit voltages and temperature differences for various heater currents. The temperature hot junction of the shape-engineered thermocouple was sensed by the nearby temperature detector. The open-circuit voltage of the TC as a function of the heater current was measured using the 2ω method previously discussed herein. The temperature increase at the hot junction, ΔT, was obtained from the measured resistance change, ΔR, of the RTD using $\Delta T = \Delta R / R_0 \alpha$, where $R_0$ is the initial resistance, and α is the temperature coefficient of resistance which was calculated using a known standard y. From here, the open-circuit voltage was plotted as a function of ΔT. The slope of the $V_{OC}$ vs. ΔT is the relative Seebeck coefficient of a TC according to eqn (1).

Figure 10:
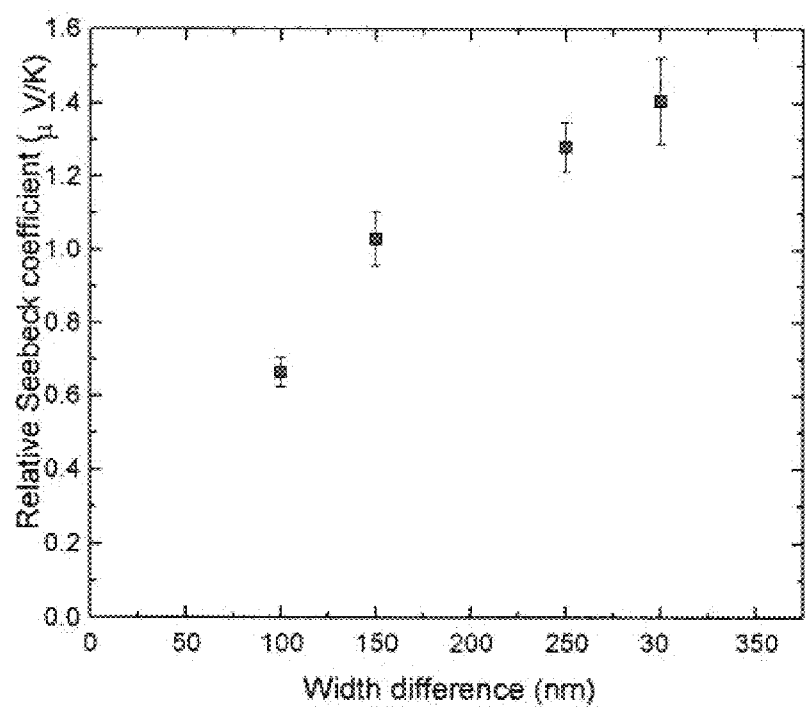
FIG. 10 is a graph of relative Seebeck coefficients as a function of the width difference for the nanowire leads of the thermocouple.

The relative Seebeck coefficients were plotted against the nanowire diameter difference as can be seen in FIG. 10. The data showed that the relative Seebeck coefficient increased with difference in width between the two segments. This observed behavior implied that the absolute Seebeck coefficient increased with wire width. The sublinear behavior shown in FIG. 10 was consistent with the idea the coefficient will reach a saturation of the absolute Seebeck coefficient at the bulk value as the nanoscale dimensions increase. It can be presumed that the data saturates at the 2D thin film value.

The difference in Seebeck coefficients ($S_A$–$S_B$) observed in the narrow thin-film wires is relatively large, on the order of 10% of the bulk value, which suggests that these TCs may be of practical value. Furthermore, this data suggest for shape-engineered thermocouples to function they must have the proper dimensions, such as being in the nanoscale, in order to produce a thermocouple with a non-zero relative Seebeck coefficient. Mono-metallic thermocouples at larger dimensions will behave as bulk materials and any geometric differences will not produce a relative Seebeck coefficient. $S_A$ will equal $S_B$ as they both with be equal to the material's absolute Seebeck coefficient, and therefore, ΔS will equal zero.

Antenna-Coupled Shape-Engineered Thermocouples

As shown in FIG. 1, shape-engineered thermocouples 10 can be coupled to antennae 12 to act as a detector of a specific wavelength of radiation. When an antenna 12 absorbs radiation, a current is produced, which in turn results in localized heating. This heating is most effective at the center of the antenna. In one embodiment of the invention, the thermocouple response can be used as a detector by placing the junction of the two conductors 11 at the center of the antenna. The fabrication complexity of the antenna-coupled shape-engineered thermocouples (ACSET) 15 is significantly reduced by using one single metal, i.e., only one electron beam lithography step and one metal deposition.

The antenna-coupled shape-engineered thermocouples can be used in a number of applications. Arranged in an array, the ACSET can form the basis for an infrared imaging detector. The long-wave infrared (LWIR) regime is of special interest for infrared detectors due to the low atmospheric attenuation of electromagnetic waves in this range, and the match with the wavelengths of black body radiation of objects at room temperature. Nanoantennas were built in which resonant currents due to LWIR radiation heated attached thermocouples, generating open circuit voltages. Similarly, in an array of antenna tuned to different wavelengths, the ACSETs can form an imaging detector for hyperspectral imaging.

Another application for the ACSETs is in energy harvesting which may or may not require an antenna be coupled to the shape-engineered thermocouple. Where traditional photovoltaics are not able to take full advantage of the infrared spectrum, ACSETs are able to capture a larger portion of the spectrum. In these applications, a thermopile arrangement similar to the one show in FIG. 4 may be used to increase the generated response or capture a greater amount of the energy available. In these applications, imprint lithography techniques may be employed to easily and cheaply generate a large number of shape-engineered thermocouple devices.

EXAMPLE 3

ACSET Fabrication

This example demonstrates the fabrication of shape-engineered thermocouples. Fabrication of the characterization platform and of the antenna-coupled shape-engineered thermocouples involved electron beam lithography and a single metal deposition, greatly reducing the fabrication complexity compared to the bi-metallic antenna-coupled thermocouples. Nanoimprint lithography tools can also be used to allow a single metal device to be fabricated with nanoscale features.

In one embodiment, a dipole antenna is attached to the shape-engineered thermocouple. While the discontinuous junction is illustrated as being located at the center of the antenna, it can be otherwise located as may be required and/or desired in other embodiments. Joule heating of the junction occurs due to the radiation-induced antenna currents. The geometry of the antenna determines the resonant frequency, the directivity, and the polarization of the detector. Different antenna configurations are within the scope of the invention disclosed herein as would be understood to one skilled in the art.

In one embodiment, the antenna may a dipole antenna of 2.4 μm. The antenna may also be of a different configuration or size depending on the signal it is designed to receive.

In one embodiment, gold bonding pads were fabricated by optical lithography on top of an aluminum ground plane covered by a 1.2 μm thick PECVD-deposited $SiO_2$ layer. This substrate configuration allowed for the constructive interference of the incident IR waves and those reflected from the aluminum ground plane, and therefore increased the response of the devices. Thermocouples were fabricated using a range of materials including Ni, Pd, and Cr by electron beam lithography and lift-off and all displayed essentially the same behavior.

Figure 4:
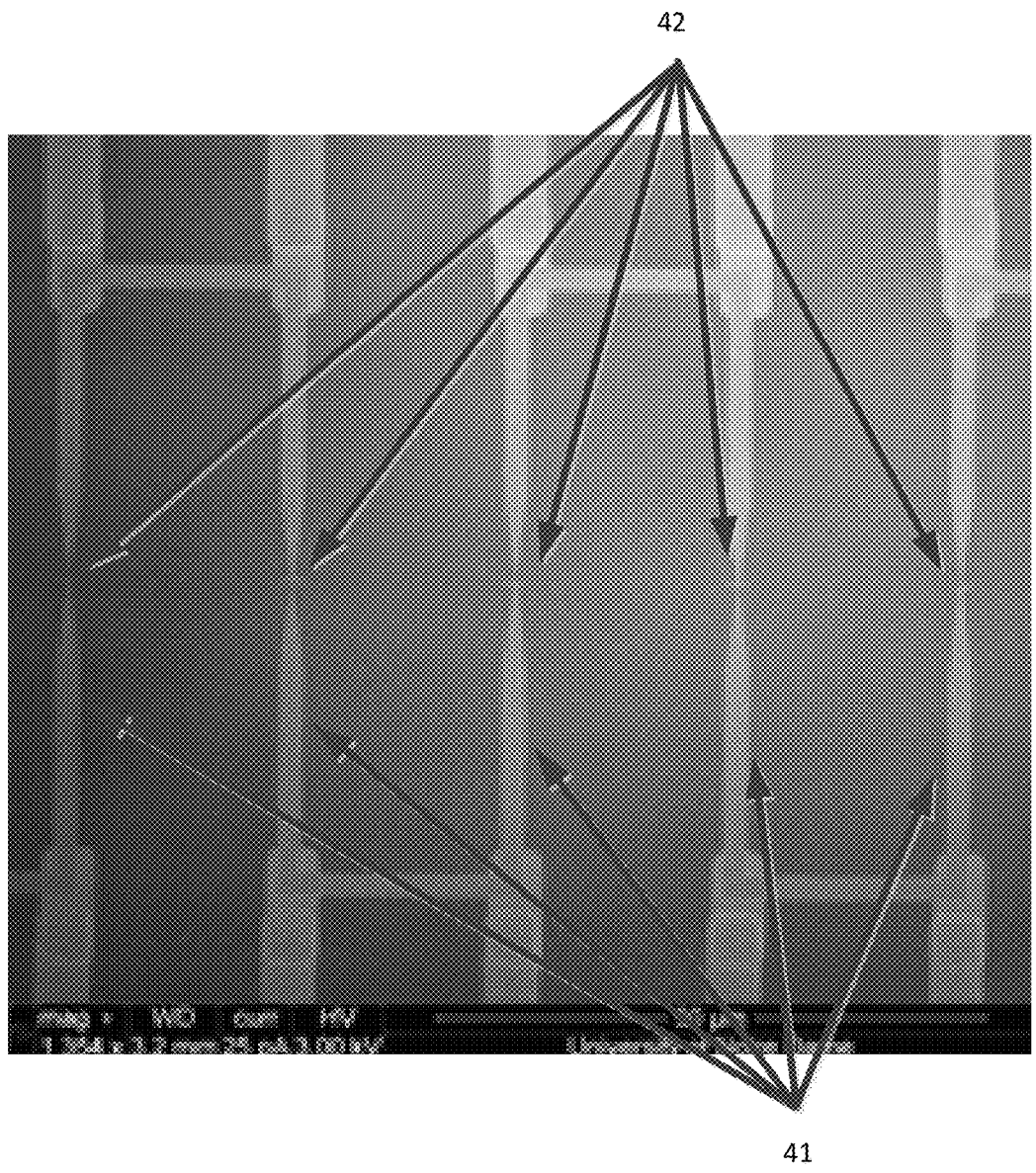
FIG. 4 is a scanning electron micrograph image of a thermopile constructed from multiple antenna-coupled thermocouples.
Figure 5:
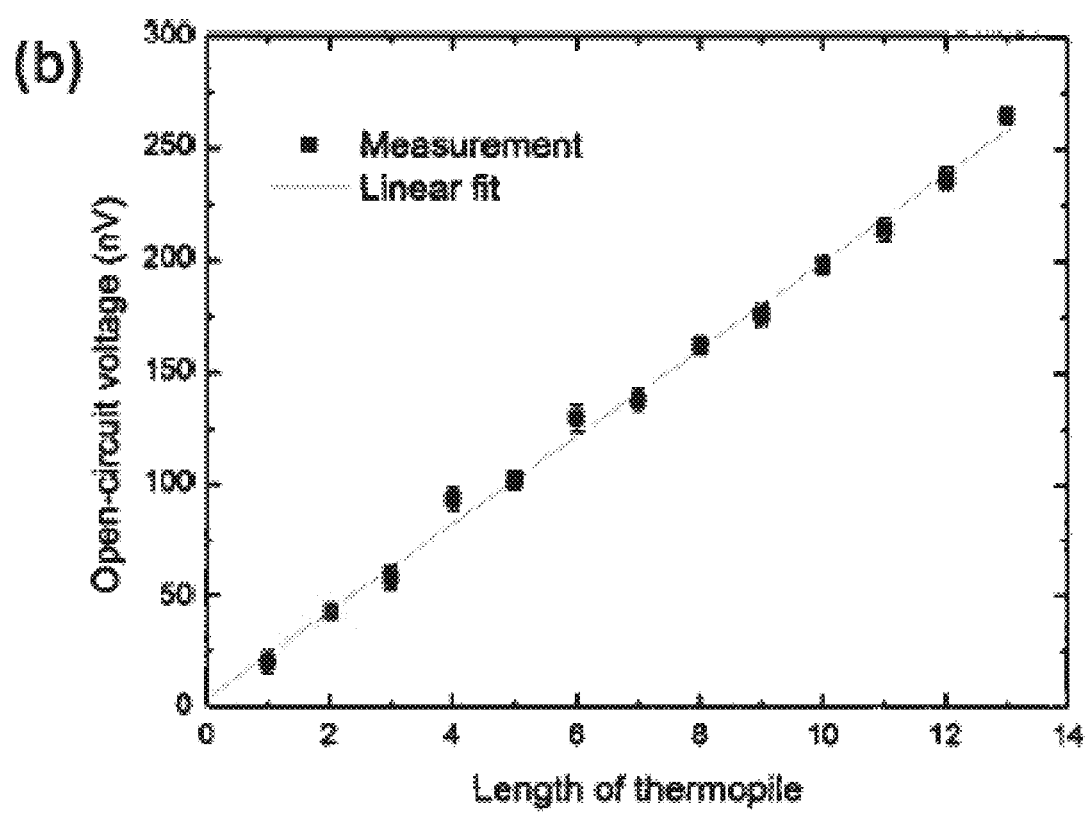
FIG. 5 is a graph of a thermopile open-circuit voltage as a function of thermopile length.

The response of the devices was increased by connecting the individual detectors in series, i.e., by building a thermopile as is represented in FIG. 4. Each thermocouple device 41 possessed its own read-out interconnects and was coupled to an antenna 42 to allow measurement of arbitrary thermopile length, and to perform individual IR measurements. The thermopile addition rule was obeyed as shown in FIG. 5, i.e., the measured open-circuit voltage increased linearly as a function of thermopile length.

EXAMPLE 4

Polarization-Dependence of ACSETs

This example demonstrates the polarization-dependence of an antenna coupled to a shape-engineered TC.

Figure 2:
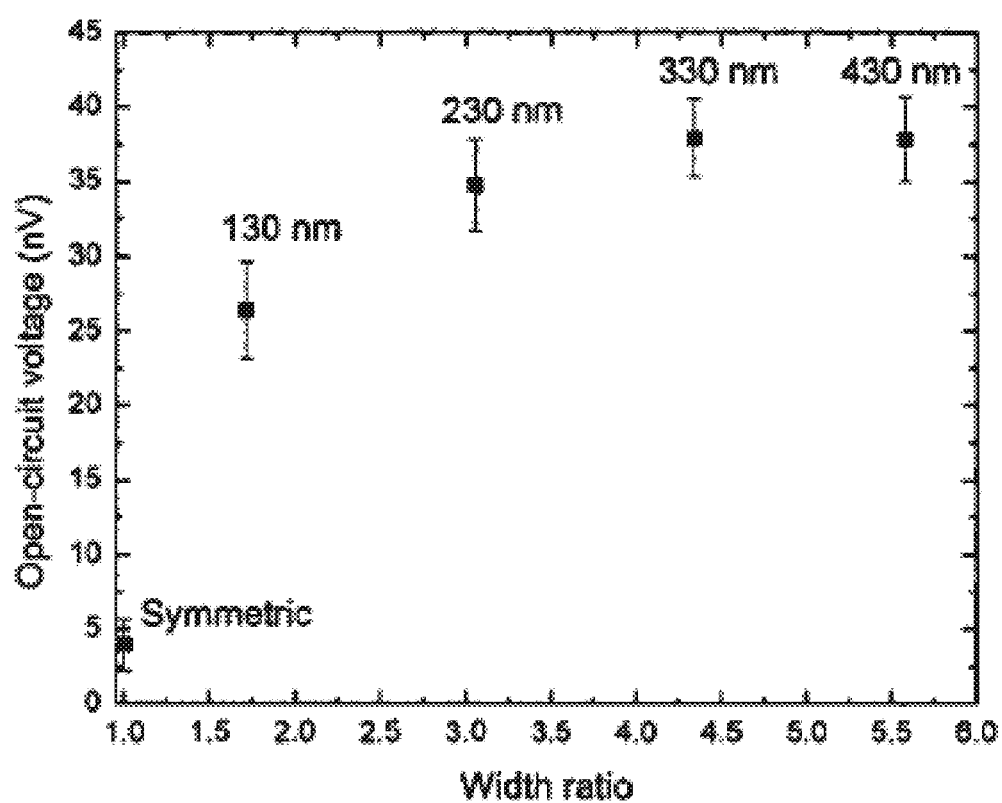
FIG. 2 is a graph of open-circuit voltage as a function of the width ratio between the abrupt junction of two nanowire conductors.
Figure 3:
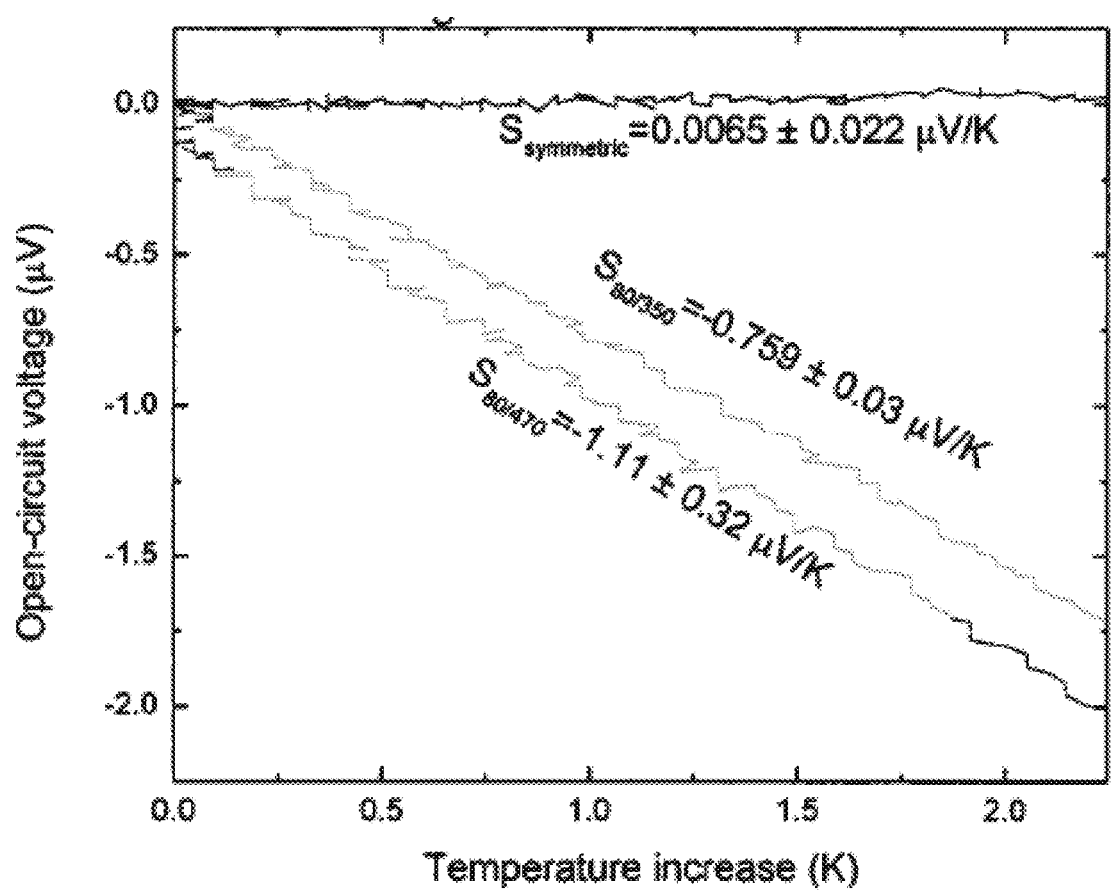
FIG. 3 is a graph of the relative Seebeck coefficients of a symmetric and two asymmetric shape-engineered thermocouples as a function of temperature increase.

In one embodiment the ACSETs were illuminated by a linearly polarized $CO_2$ laser beam with 1.42 W/cm2 intensity and 10.6 μm wavelength. The measured open-circuit voltage increased as a function of the width ratio of the lead lines caused by the increase in relative Seebeck coefficient as shown in FIG. 2. Devices with symmetric lead lines showed no IR response, as the absolute Seebeck coefficients are the same for both lead lines. The polarization-dependent response of the devices was achieved by rotating the polarization angle of the laser beam via a half-wave plate. The devices followed the cosine square dependency as predicted by the antenna theory. This supports the theory of the detection mechanism, i.e., that the hot junction was heated by the radiation-induced antenna currents.

In another embodiment, the ACSETs were illuminated by a linearly polarized $CO_2$ laser beam operating at 28.3 THz. Polarization dependent measurements were performed by rotating the polarization of the beam with a half-wave plate. The resonant dipole antenna length on $Si/Al/SiO_2$ substrates was determined by COMSOL Multiphysics® to be 2.4 µm. The widths of the antenna lead lines were 70 nm and 150 nm.

The maximum open-circuit voltage was measured when the polarization of the incident electromagnetic field of the beam was parallel with the antenna axis (0 deg. and 180 deg.). The minimum response was measured when the polarization of the beam and the antenna axis were perpendicular (90 deg. and 270 deg.).

These devices followed the cosine square dependence expected from a dipole antenna supporting our antenna-based detection mechanism.

While certain examples and descriptions have been provided herein so that others may follow the teachings of this invention, the scope of coverage is not intended to be limited by these items. On the contrary, this patent is intended to cover all embodiments, methods, articles of manufacture which fall fairly within the scope the claims.

What is claimed is:

1. A thermocouple assembly, comprising:
a mono-metallic nanowire made of a single conductive material having a length and at least one variation in a cross-sectional area along the length;
wherein the at least one variation in the cross-sectional area along the length provides a junction point that is intermediate first and second segments of the mono-metallic nanowire and wherein the junction point and the first and second segments of the mono-metallic nanowire form a thermocouple,
wherein the first and second segments of the mono-metallic nanowire have a different width leading to the junction point and wherein the width of the first and second segments of the mono-metallic nanowire are each less than 1 µm, and
wherein a third segment of the mono-metallic nanowire, wherein the third segment has the same width as the first segment, and the second segment is intermediate the first and third segments.

2. The thermocouple assembly as recited in claim 1, wherein the width of the first segment and the width of the second segment differ by more than about 50 nm and less than about 500 nm.

3. The thermocouple assembly as recited in claim 2, wherein the cross-sectional area of the first segment and the cross-sectional area of the second segment differ by a ratio that is in a range between about 6.0 and about 1.0.

4. The thermocouple assembly as recited in claim 1, wherein the at least one variation in the cross-sectional area is provided by a discontinuity in the mono-metallic nanowire.

5. The thermocouple assembly as recited in claim 1, wherein the single conductive material is selected from a group consisting of nickel, palladium, and chromium.

6. The thermocouple assembly as recited in claim 1, comprising a substrate carrying the thermocouple.

7. An antenna-coupled thermocouple assembly, comprising:

a mono-metallic nanowire made of a single conductive material having a length and at least one variation in a cross-sectional area along the length; and
an antenna co-located with the mono-metallic nanowire along the length;
wherein the at least one variation in the cross-section area along the length provides a junction point that is intermediate first and second segments of the mono-metallic nanowire and wherein the junction point and the first and second segments of the mono-metallic nanowire form a thermocouple,
wherein the first and second segments of the mono-metallic nanowire have a different width leading to the junction point and wherein the width of the first and second segments of the mono-metallic nanowire are each less than 1 µm, and
wherein a third segment of the mono-metallic nanowire, wherein the third segment has the same width as the first segment, and the second segment is intermediate the first and third segments.

8. The antenna-coupled thermocouple assembly as recited in claim 7, wherein antenna is co-located with the mono-metallic nanowire at the at least one variation in the cross-sectional area along the length.

9. The antenna-coupled thermocouple assembly as recited in claim 8, wherein the antenna is centered about the at least one variation in the cross-sectional area along the length.

10. The antenna-coupled thermocouple assembly as recited in claim 7, wherein the width of the first segment and the width of the second segment differ by more than about 50 nm and less than about 500 nm.

11. The antenna-coupled thermocouple assembly as recited in claim 10, wherein the cross-sectional area of the first segment and the cross-sectional area of the second segment differ by a ratio that is in a range between about 6.0 and about 1.0.

12. The antenna-based thermocouple assembly as recited in claim 7, wherein the at least one variation in the cross-sectional area is provided by a discontinuity in the mono-metallic nanowire.

13. The antenna-based thermocouple assembly as recited in claim 8, wherein the single conductive material is selected from a group consisting of nickel, palladium, and chromium.

14. The thermocouple assembly as recited in claim 1, further comprising:
an antenna co-located with the mono-metallic nanowire along the length whereby, in response to the antenna receiving a radiative energy the thermocouple will be caused to generate a voltage signal.

15. The thermocouple assembly as recited in claim 14, wherein the antenna is co-located at the variation in the cross-sectional area along the length.

16. The thermocouple assembly as recited in claim 15, wherein the antenna is co-located proximate the variation in the cross-sectional area along the length.

17. The thermocouple assembly as recited in claim 14, wherein the antenna is tuned to detect a desired radiative energy.

18. The thermocouple assembly as recited in claim 14, wherein the single conductive material is selected from a group consisting of nickel, palladium, and chromium.

19. The thermocouple assembly as recited in claim 1, wherein the first and third segments have a width of about 150 nm and the second segment has a width of about 50 nm.

20. The thermocouple assembly as recited in claim 1, wherein the mono-metallic nanowire has a thickness of a single layer of metal.

21. The thermocouple assembly as recited in claim 20, wherein the thickness of the single layer of metal is formed by a single metal deposition.

22. The thermocouple assembly as recited in claim 1, wherein the width is controlled by electron-beam lithography.

23. The thermocouple assembly as recited in claim 14, wherein the antenna is formed of the same material as the mono-metallic nanowire.

* * * * *